(12) United States Patent
Kang

(10) Patent No.: US 7,818,527 B2
(45) Date of Patent: Oct. 19, 2010

(54) WRAPPER CIRCUIT AND METHOD FOR INTERFACING BETWEEN NON-MUXED TYPE MEMORY CONTROLLER AND MUXED TYPE MEMORY

(75) Inventor: Shin-Chan Kang, Seoul (KR)

(73) Assignee: Samsung Electronics Co., Ltd., Suwon-si (KR)

( * ) Notice: Subject to any disclaimer, the term of this patent is extended or adjusted under 35 U.S.C. 154(b) by 431 days.

(21) Appl. No.: 11/495,026

(22) Filed: Jul. 28, 2006

(65) Prior Publication Data

US 2007/0036005 A1    Feb. 15, 2007

(30) Foreign Application Priority Data

Aug. 11, 2005    (KR)    ...................... 10-2005-0073866

(51) Int. Cl.
    *G06F 13/00*    (2006.01)
(52) U.S. Cl. ...................................... 711/167; 711/154
(58) Field of Classification Search ................. 711/154, 711/167
    See application file for complete search history.

(56) References Cited

U.S. PATENT DOCUMENTS

| 4,017,839 | A | * | 4/1977 | Calle et al. ..................... 710/51 |
| 4,296,465 | A | * | 10/1981 | Lemak ......................... 710/316 |
| 5,822,761 | A | * | 10/1998 | Nishimukai et al. ......... 711/138 |
| 5,918,027 | A |   | 6/1999 | Osakabe ..................... 395/309 |
| 5,970,240 | A | * | 10/1999 | Chen et al. .................... 703/25 |
| 7,111,108 | B2 | * | 9/2006 | Grundy et al. .............. 711/100 |
| 2003/0128596 | A1 | * | 7/2003 | Peterson et al. ......... 365/189.11 |
| 2004/0165472 | A1 | * | 8/2004 | Yamazaki .................... 365/233 |
| 2006/0106951 | A1 | * | 5/2006 | Bains ............................ 710/5 |

FOREIGN PATENT DOCUMENTS

| JP | 02-177190 | 7/1990 |
| KR | 1997-51140 | 7/1997 |
| KR | 1998-52836 | 10/1998 |

* cited by examiner

*Primary Examiner*—Reba I Elmore
(74) *Attorney, Agent, or Firm*—F. Chau & Associates, LLC

(57) ABSTRACT

A wrapper circuit effectively converts a muxed-type memory (having time-multiplexed address and data lines) into a non-muxed type memory as seen by the controller (a non-muxed type memory controller). Wrapper circuit includes a select circuit (e.g., multiplexer) and an input/output buffer. The select circuit receives write data and an address from a non-muxed type memory controller and selects either the write data or the address according to a first control signal. The input/output buffer receives the selection among the write data and the address and passes the write data or the address to a muxed type memory. The input/output buffer also passes read data received from the memory to the memory controller.

20 Claims, 9 Drawing Sheets

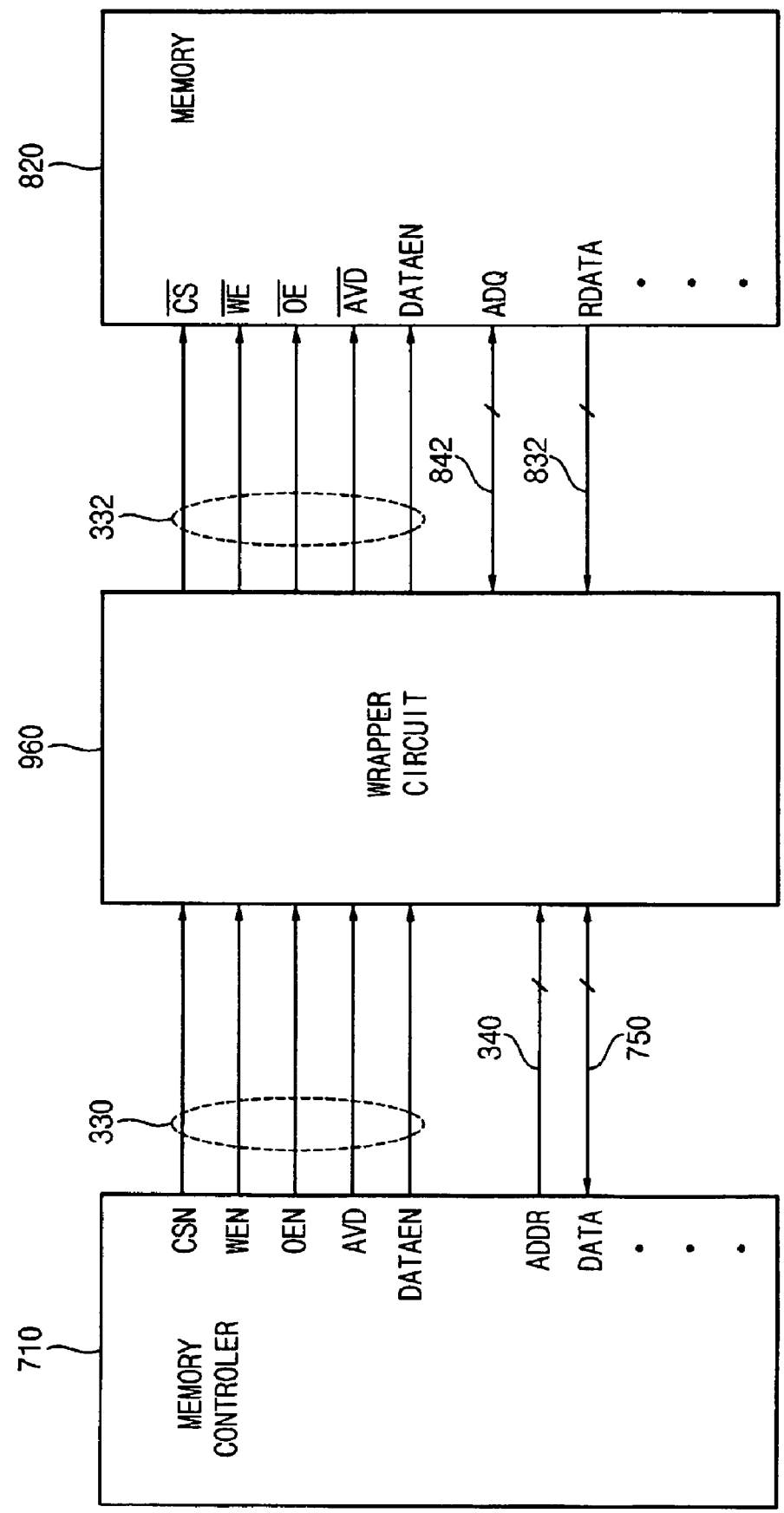

WRAPPER CIRCUIT AND METHOD FOR INTERFACING BETWEEN NON-MUXED TYPE MEMORY CONTROLLER AND MUXED TYPE MEMORY

CROSS-REFERENCE TO RELATED APPLICATION

This application claims priority under 35 U.S.C. §119 of Korean Patent Application No. 2005-73866 filed on Aug. 11, 2005, the contents of which are incorporated herein by reference in their entirety.

BACKGROUND OF THE INVENTION

1. Field of the Invention

The present invention relates to a memory system. More particularly, the present invention relates to a wrapper circuit for interfacing between a (non-muxed type) memory controller in which an address port and a data port are distinct from each other and a (muxed type) memory in which an address port and a data port are shared (time-multiplexed, not physically distinct from each other).

2. Description of the Related Art

A memory is a device that stores data. A memory may be classified as either a volatile memory or a nonvolatile memory. Volatile memories include dynamic random access memories (DRAM), static random access memories (SRAM). An example of a volatile memory includes a uni-transistor random access memory (UtRAM). Examples of nonvolatile memories include a mask read only memory (ROM), an erasable programmable read only memory (EPROM), an electrically erasable programmable read only memory (EEPROM), a flash memory, etc. In addition, a further examples of nonvolatile memories are a ferroelectric random access memory (FRAM), a phase-change random access memory (PRAM) and a magnetic random access memory (MRAM).

The memory types may be further divided into synchronous memories and asynchronous memories depending on whether an operation of the memory is synchronized to a clock signal or not. The asynchronous memory was used more often in the past, but the synchronous memories are more frequently used in recent designs. For example, an asynchronous type of the "NOR flash" memory was more often used in the past, while a synchronous type of "NOR flash" memory is more frequently used in recent years.

The memory chips (memory chip packages) used today have a lot of pins so as to implement various functions. However, equipping the memory with many pins increases the cost of manufacturing of a memory (chip) package and of implementing a system using the memory. Accordingly, efforts have been made to reduce the number of pins. Particularly, a technology in which an address port (address pins or lines) and a data port (data pins or lines) are shared (time-multiplexed, not distinct from each other) is now popular. This technology will be described in further detail with reference to FIGS. 1 and 2.

FIG. 1 is a block diagram illustrating a memory system in which an address port and a data port are separate (distinct) from each other.

A memory 120 is used together with a memory controller 110 in a system. The memory controller 110 receives data through a system bus (not shown) and stores the received data in the memory 120. The memory controller 110 also receives the data stored in the memory and transfers the stored data to the system bus. In other words, the memory controller 110 interfaces between the memory 120 and the system bus.

The memory controller 110 provides control ports 130 (CSN, WEN, OEN, AVD, DATAEN) for accessing the memory 120, an address 140 for designating an access location on the memory 120, and data 150 to the memory 120. Also, the memory controller 110 receives the data 150 stored in a specific location of the memory 120 from the memory 120. In FIG. 1, in the memory controller 110 and the memory 120, a port for sending/receiving an address (140) and a port for sending/receiving data (150) are distinct (separate, non-multiplexed) from each other. The address 140 is outputted from an address port of the memory controller 110 and inputted to an address port of the memory 120. The data 150 (while writing data) is outputted from a data port of the memory controller 110 and inputted to a data port of the memory 120, and data 150 (while reading data) is outputted from the data port of the memory 120 and inputted to the data port of the memory controller 110.

FIG. 2 is a block diagram illustrating a memory system in which an address port and a data port are shared (time-multiplexed on the same pins, not distinct from each other).

A memory 220 is used together with a memory controller 210 in a system. The memory controller 210 receives data through a system bus and stores the data in the memory 220, or receives the data stored in the memory 220 and sends the data to the system bus (not shown).

The memory controller 210 sends control signals 230 for accessing the memory 220, an address for designating an access location on the memory 220, and writes data 240 to the memory 220. Further, the memory controller 210 receives read data 250 stored in a specific location of the memory 220 from the memory 220. In this case, both the memory controller 210 and the memory 220 use a shared (time-multiplexed on the same pins, not distinct from each other) address port and a write data port.

A non-multiplexed (non-muxed) type memory controller is required for a memory as in FIG. 1 in which the address port and the data port are distinct from each other (hereinafter referred to herein as "non-muxed type memory" and sometimes referred to as a "demuxed type memory"), and a muxed type memory controller is required for a memory as in FIG. 2 in which the address port and the data port are shared to each other (hereinafter referred to as "muxed type memory"). Meanwhile, the memories may be a non-muxed type (120 in FIG. 1) or a muxed type memory (220 in FIG. 2) depending on manufacturers and depending on the capacity of the memory.

Mobile devices are applications that use memory and are increasingly popular. Mobile devices preferably use a muxed type memory having a small number of memory pins. Accordingly, the conventional non-muxed type memory controller can not be used with the muxed type memory. Although it is possible that a muxed type controller suitable for the muxed type may be specially designed, the cost for manufacturing it is high. Accordingly, a logic circuit that controls the muxed type memory using the conventional non-muxed type memory controller has been required.

SUMMARY OF THE INVENTION

An aspect of the invention provides a wrapper circuit that effectively converts a muxed-type memory (having time-multiplexed address and data lines) into a non-muxed type memory "as seen by" a memory controller (a non-muxed type memory controller). The wrapper circuit includes a select circuit (e.g., multiplexer) and an input/output buffer.

Exemplary embodiments of the present invention provide a wrapper circuit for interfacing between a non-muxed type memory controller and a muxed type memory (so that the non-muxed type memory controller having an address port and a data port that are distinct from each other controls the muxed type memory having an address port and a data port that are shared (i.e., not distinct from each other, multiplexed).

Exemplary embodiments of the present invention provide an electronic circuit capable of controlling a memory having an address port and a data port that are shared (not distinct from each other, multiplexed) using a memory controller having an address port and a data port that are distinct from each other, employing a wrapper circuit.

Exemplary embodiments of the present invention also provide a memory system using a memory controller having an address port and a data port that are distinct from each other, a wrapper circuit, and a memory having an address port and a data port that are shared (i.e., not distinct from each other, multiplexed).

In some exemplary embodiments, an electronic circuit includes a memory controller in which a first address port and a first data port are distinct from each other, and a wrapper circuit coupled to the memory controller and configured to interface between a memory, in which a second address port and a second data port are shared (i.e., not distinct from each other, multiplexed), and the memory controller. The circuit may further include a selecting pin that receives a muxed select control signal (MuxedSel), and the wrapper circuit interfaces between the memory and the memory controller when the muxed select control signal (MuxedSel) is enabled.

In other exemplary embodiments, a wrapper circuit includes a select circuit configured to receive write data and an address from a memory controller having a first address port and a first data port that are distinct from each other, and configured to output either the write data or the address according to a first control signal and an input/output buffer. The input/output buffer is configured to receive the write data and the address to provide the received write data and the received address to a memory having a second address port and a second data port that are shared (i.e., not distinct from each other, multiplexed), and configured to receive read data to provide the received read data to the memory controller. The wrapper circuit may further include a select pin receiving a muxed select control signal (MuxedSel), wherein the wrapper circuit interfaces between the memory controller and the memory when the muxed select control signal is enabled.

In other exemplary embodiments, a memory system includes a memory in having first address port and a first data port that are shared, a memory controller having a second address port and a second data port that are distinct from each other and a wrapper circuit coupled to the memory controller and the memory that is configured to interface between the memory and the memory controller. The memory system may further include a select pin configured to receive a muxed select control signal (MuxedSel), wherein the wrapper circuit interfaces between the memory and the memory controller when the muxed select control signal (MuxedSel) is enabled.

In other exemplary embodiments, an interfacing method includes providing a memory having a first address port and a first data port that are shared (i.e., not distinct from each other, multiplexed) and a memory controller having a second address port and a second data port that are distinct from each other. The interfacing method also includes transferring at least one of an address and write data received from the memory controller to the memory and transferring read data received from the memory to the memory controller.

In the various embodiments, the first data port may function only as a predetermined one of a write data port and a read data port, and the second data port may function alternately as a write data port and as a read data port.

Alternatively, in the various embodiments, the first data port may function alternately as a write data port and as a read data port, and the second data port may function alternately as a write data port and as a read data port.

Alternatively, in the various embodiments, the first data port may function only as a predetermined one of a write data port and a read data port, and the second data port may function only as a predetermined one of a write data port and a read data port.

Alternatively, in the various embodiments, the first data port may function alternately as a write data port and as a read data port, and the second data port may function only as a predetermined one of a write data port and a read data port.

BRIEF DESCRIPTION OF THE DRAWINGS

The above and other features and advantages of the present invention will become more apparent by describing in detailed exemplary embodiments thereof with reference to the accompanying drawings, wherein:

FIG. 9 is a block diagram of a memory system according to still another exemplary embodiment of the present invention.

DETAILED DESCRIPTION OF THE EXEMPLARY EMBODIMENTS

Figure 1:
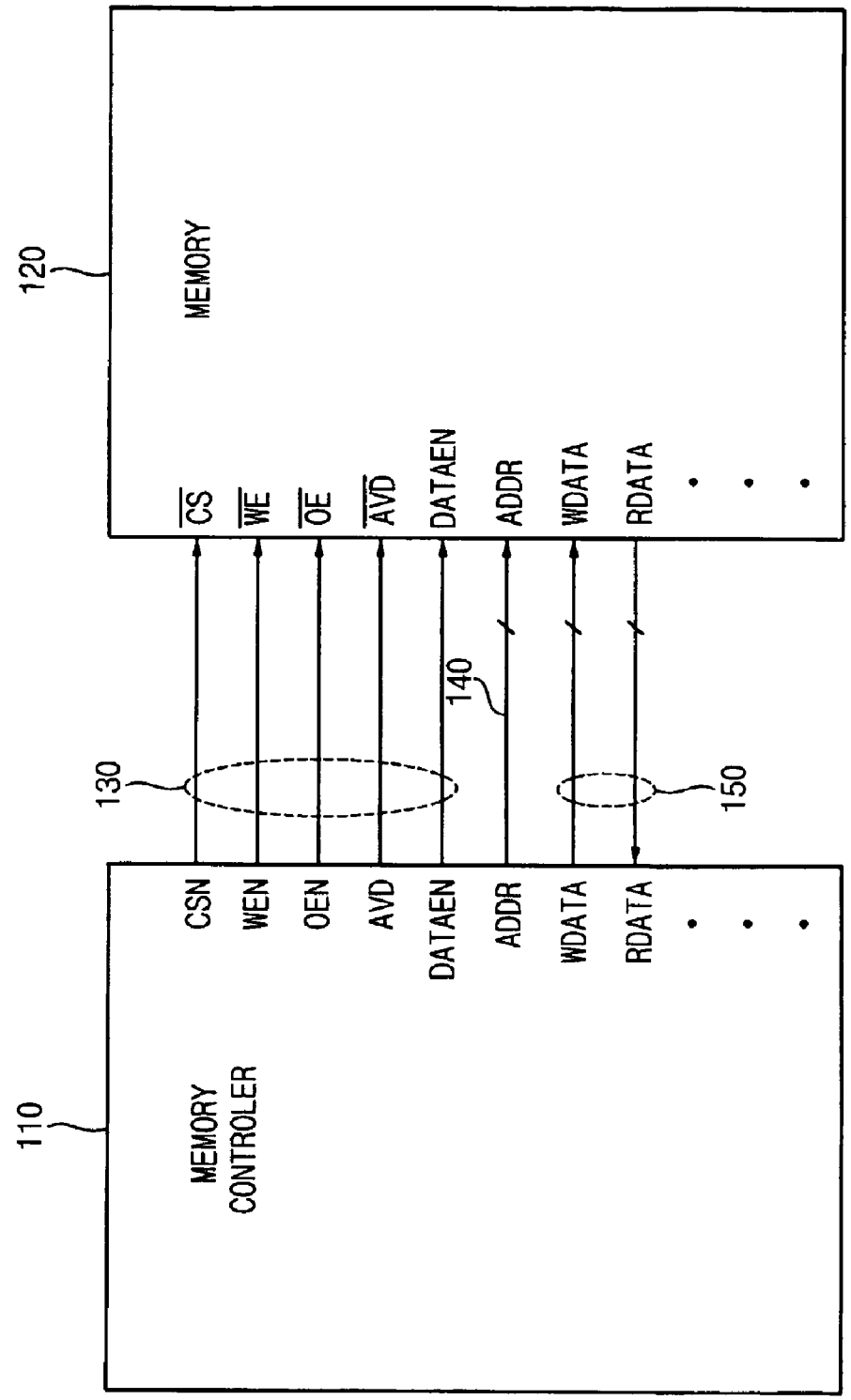
FIG. 1 is a block diagram illustrating a memory system in which an address port and a data port are distinct from each other (non-multiplexed)
Figure 2:
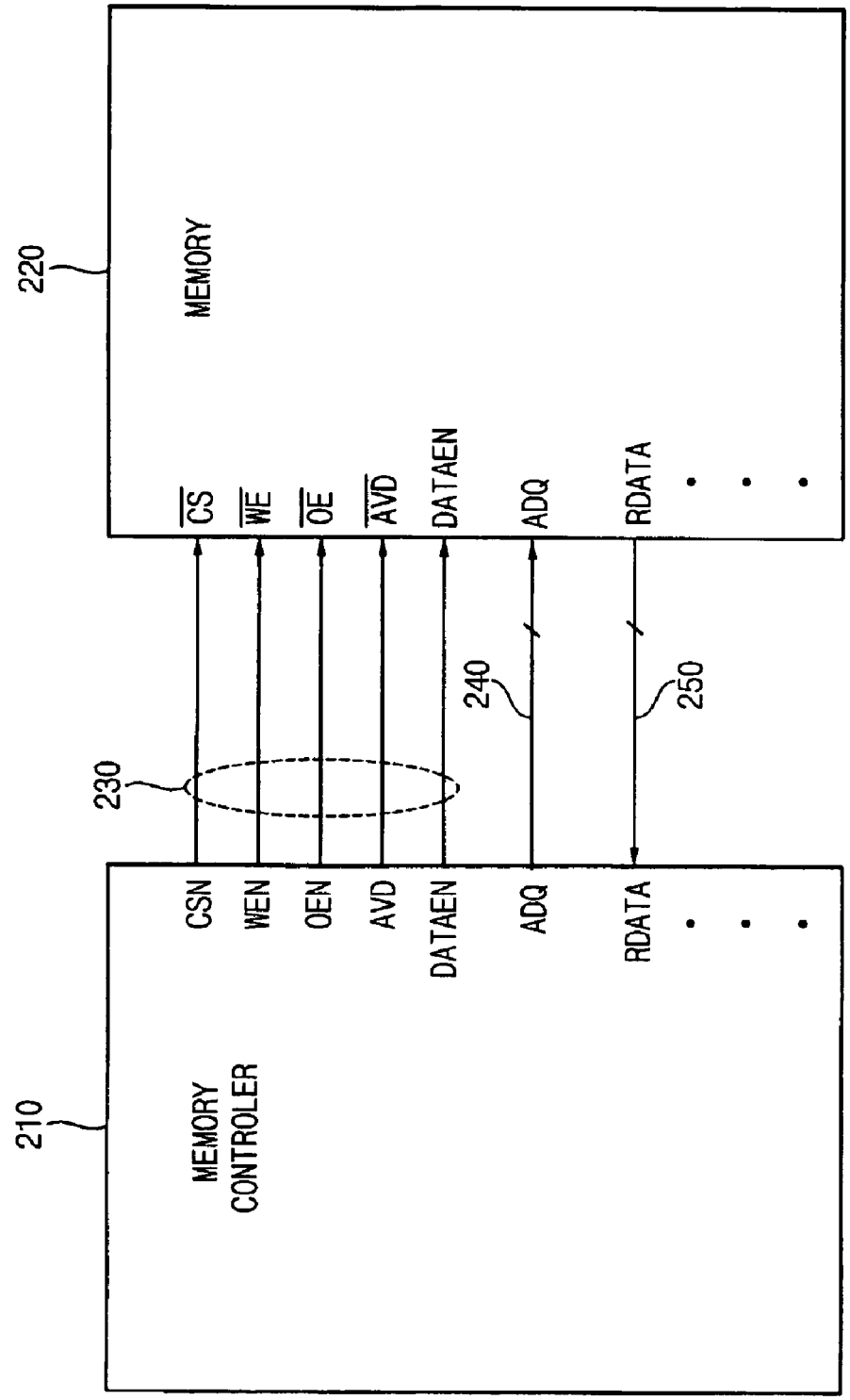
FIG. 2 is a block diagram illustrating a memory system in which an address port and a data port are shared (i.e., not distinct from each other, multiplexed)
Figure 3:
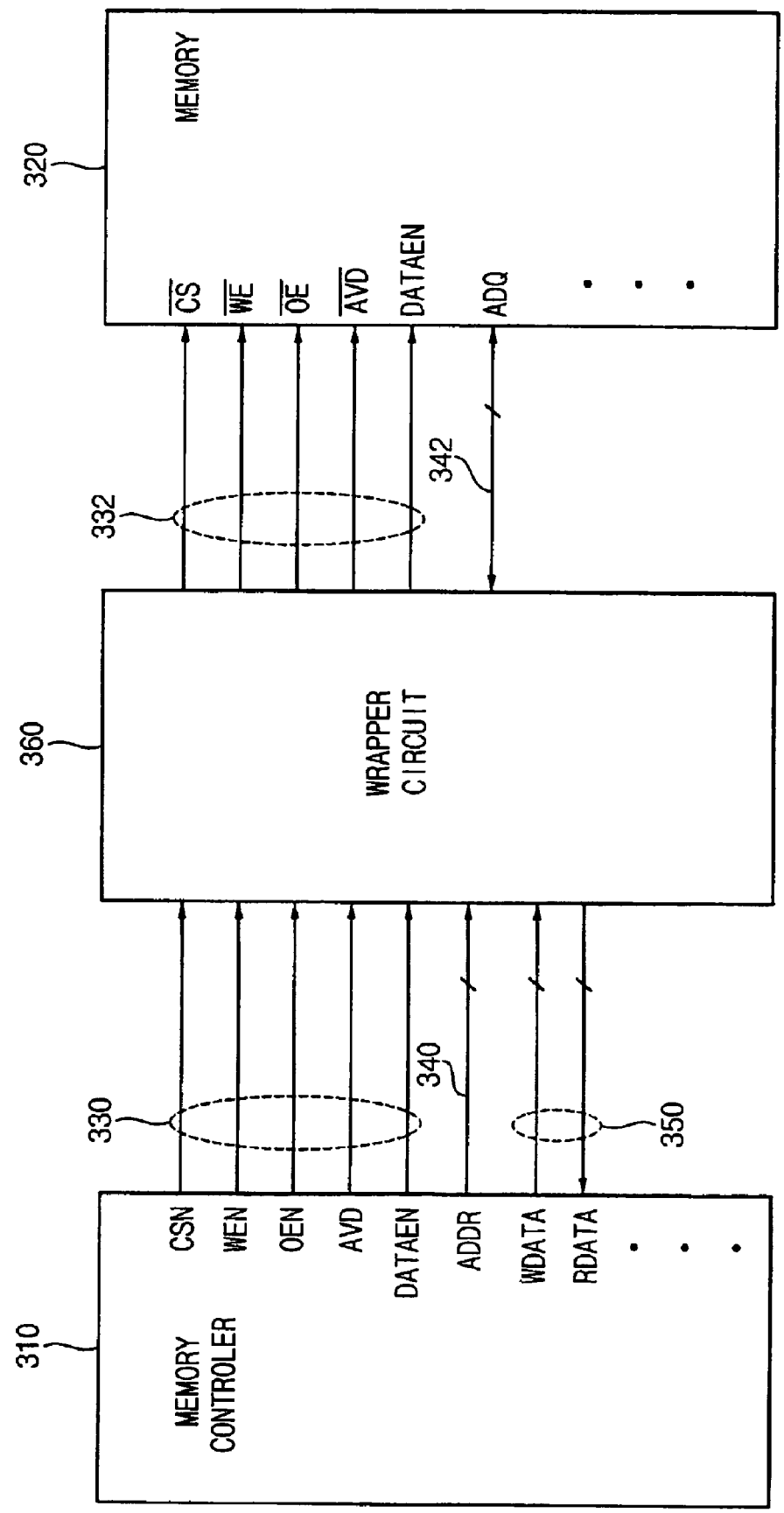
FIG. 3 is a block diagram of a memory system according to an exemplary embodiment of the present invention.

FIG. 3 is a block diagram illustrating a memory system according to an exemplary embodiment of the present invention. The memory system includes a memory controller 310, a memory 320 and a wrapper circuit 360 for interfacing between the memory controller 310 and the memory 320. The wrapper circuit 360 effectively converts the muxed-type memory 320 into a non-muxed type memory "as seen by" the controller 310 (a non-muxed type memory controller).

The memory controller 310 is a non-muxed type in which the address port and the (two) data ports are distinct from each other. The memory controller 310 includes control ports (CSN, WEN, OEN, AVD, DATAEN) for sending control signals 330, an address port (ADDR) for providing an address 340 and data ports (WDATA, RDATA) for providing or receiving data 350.

The memory 320 is a muxed type in which the address port and a data port are shared (time-multiplexed over the same bus lines). The memory 320 includes control ports (/CS, /WE, /OE, /AVD) for receiving control signals 332 and an address/data port (ADQ) for receiving an address 342 or write data 342 and providing read data 342.

The wrapper circuit 360 interfaces between the non-muxed type memory controller 310 and the muxed type memory 320. In other words, the wrapper circuit 360 receives the non-multiplexed address 340 or the write data 350 (from a system bus, not shown), and provides the received address 340 or the received write data 342 as time-multiplexed signals to the shared (time-multiplexed) address/data port (ADQ) of the muxed type memory 320. The wrapper circuit 360 receives the read data 342 from the memory 320 and provides the received read data 342 to the read data port 350 (RDATA) of the memory controller 310. The wrapper circuit will be described in greater detail with reference to FIG. 4.

Figure 4:
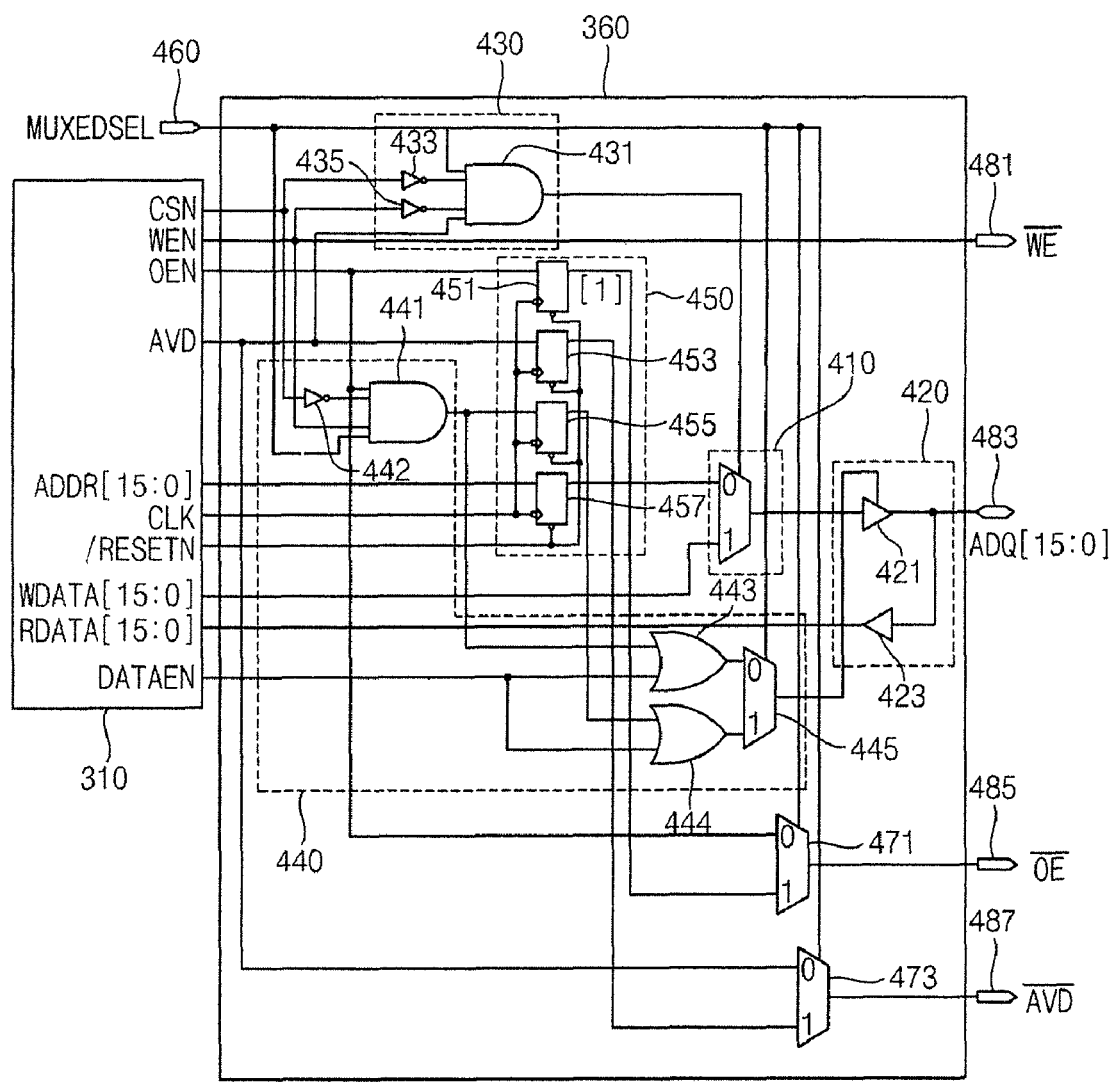
FIG. 4 is a circuit diagram of a wrapper circuit according to an exemplary embodiment of the present invention.

FIG. 4 is a circuit diagram of a wrapper circuit according to an exemplary embodiment of the present invention. For convenience of explanation, the example implements a synchronous memory system. However, alternative embodiments of the invention can be applied to an asynchronous memory system.

Signals provided from the memory controller 310 may be named variously. The memory controller may include other signals according to the type of the memory controller and thus may not include all of the signals used in the exemplary embodiment shown in FIG. 4.

A chip select control signal (CSN) is an active-low enable signal for enabling the memory controller 310 to select a memory chip. When the CSN is set to a low state, the memory controlled by the memory controller 310 becomes in an active state. The CSN may be called as a "chip enable" (CE) signal in other memory controllers.

A write control signal (WEN) is an active-low enable signal and is enabled (Low) during a data write operation. The write data are inputted to the memory under the control of the write control signal (WEN).

An output control signal (OEN) is an active-low enable signal and is enabled (Low) during a data read operation. The read data are outputted from the memory under the control of the output control signal (OEN).

An address valid control signal (AVD) is an active-low enable signal and indicates whether a valid address exists or not on the address bus. When the address valid control signal (AVD) is active (low) during an asynchronous read operation, all addresses may be passed through. On the other hand, in a synchronous read operation, the address valid control signal (AVD) is maintained at a low state for a clock cycle period and all addresses are latched at a rising edge of a clock signal. That is, when the address valid control signal (AVD) is at the low (active) state in the asynchronous mode, the address valid control signal (AVD) represents that the address value is valid. However, when the address valid control signal (AVD) is at the low state in the synchronous mode, the address valid control signal (AVD) indicates that the address value is valid only at the rising edge of the clock signal.

An address indicates a location in the memory. In the exemplary embodiment of the present invention shown in FIG. 4, the memory data are processed in a unit (word) consisting of 16 bits. The lower 16 bits among address bits and the 16-bit data share pins in the ADQ bus. For example, when the address has 22 bits, the lower 16 bits of the address are sent through the same port (lines or pins) as the 16 bits of write data, to the memory. An ADDR [15:0] of the memory controller 310 represents a port allocated to the lower 16 bits among address bits. An ADQ [15:0] of the memory represents a port through which write data are transmitted into the memory and through which the lower 16 bits of the address bits are transmitted to the memory.

A clock signal (CLK) is provided from the memory controller 310 and used to synchronize the wrapper circuit 360 to the memory.

A data control signal (DATAEN) is an active-high enable signal and is used in a write operation.

The write data (WDATA [15:0]) have a 16-bit word size and are written to the memory. The read data (RDATA [15:0]) have a 16-bit word size and represent the data provided by the memory to the memory controller 310.

The wrapper circuit 360 receives the non-multiplexed address or write data from the memory controller 310 and provides the address or the write data as time-multiplexed signals to the memory 320 through a (shared, time-multiplexing) address/data port 483 (ADQ [15:0]). Further, the wrapper circuit 360 receives the read data from the memory 320 through the address/data port 483 (ADQ [15:0]) and provides the received read data to the memory controller 310. The wrapper circuit 360 includes a select circuit 410 for selecting (time-multiplexing) and outputting either the address or the write data, and an input/output buffer 420. Additionally, the wrapper circuit 360 includes control signal processing circuits 430, 440 and 450 that receive control signals from the non-muxed type memory controller 310 and generate control signals for controlling the select circuit 410 and the input/output buffer 420.

The select circuit 410 selects (for time-multiplexing) either the address or the write data provided from the memory controller 310 and provides the selected one to the input/output buffer 420. In the current exemplary embodiment of the present invention, the select circuit 410 is implemented as a 16-bit multiplexer.

The input/output buffer 420 includes an output buffer 421 for outputting the selected one of the address or the write data provided from the memory controller 310, and an input buffer 423 for receiving the read data provided from the memory 320.

The select control circuit 430 provides a control signal for determining whether the select circuit 410 outputs the (selected one of the) address or the write data. In this exemplary embodiment of the present invention, the select control signal 430 is implemented with a four-input AND-gate 431 and two inverters 433 and 435. The select control circuit 430 provides a control signal that enables the select circuit 410 to output data when a chip select control signal (CSN), a write control signal (WEN) and an address valid control signal (AVD) are enabled. The select control circuit 430 provides a control signal that enables the select circuit 410 to output an address when one of the control signal (CSN), the write control signal (WEN) and an address valid control signal (AVD) is disabled.

The input/output buffer control circuit 440 provides a control signal that enables the input/output buffer 420 to output the selected one of the address or write data. In this exemplary embodiment of the present invention, the input/output buffer control circuit 440 is implemented with an AND-gate 441, an inverting buffer (inverter) 442, OR-gates 443 and 444 and a multiplexer 445. The input/output buffer control circuit 440 provides a control signal that enables the input/output buffer 420 to output the selected one of the address or the write data when a data control signal (DATAEN) is enabled, or when a write control signal (WEN) and an output control signal (OEN) are disabled and a chip select control signal (CSN) is enabled.

A timing control circuit 450 controls the timing between multiplexing the address and the write data, and between control signals. According to this exemplary embodiment of the present invention, the timing control circuit 450 is implemented with flip-flops 451, 453, 455 and 457 which are operated in synchronization with a subsiding (falling) edge of a clock signal. The timing control circuit 450 is used to allow the wrapper circuit 360 to provide proper timing required for a predetermined memory specification without deteriorating performance when the wrapper circuit 360 interfaces between the non-muxed type memory controller and the muxed type memory. The wrapper circuit 360 adjusts the timing of an output control signal (/OE) and of an address valid control signal (/AVD) for the muxed memory, and provides the output control signal (/OE) and the address valid control signal (/AVD) to the muxed memory through the ports 485 and 487, respectively. Other control signals (not shown in FIG. 4) of the non-muxed type memory controller 310 may be provided to the muxed type memory through other configuration elements (not shown) of the wrapper circuit, or may be provided to the memory without passing through (bypassing) the wrapper circuit 360.

The wrapper circuit 360 may further include a select pin 460. The select pin 460 receives a muxed select control signal (MuxedSel). The flip-flop 451 delays transmission of the output-enable OEN control signal, the flip-flop 453 delays transmission of the address valid control signal (/AVD), the flip-flop 455 delays transmission of the output of the AND-gate 441 (chip select control signal), and the sixteen [16] flip-flops 457 delay transmission of the sixteen [16] address lines [15:0] from the address port ADDR. When the muxed select control signal is high, the wrapper circuit 360 is activated, thereby interfacing between the muxed type memory and the non-muxed type memory controller 310. When the muxed select control signal is low, in the wrapper circuit 360, configuration elements for interfacing with the muxed type memory are inactivated, and thus the non-muxed type memory controller 310 may control a non-muxed type memory (not shown). In particular, when the memory controller is implemented with one chip including the wrapper circuit 360 in the conventional non-muxed type memory controller, the memory controller may control a muxed type memory (not shown) and alternately a non-muxed type memory (not shown) according to the muxed select control signal (MuxedSel) of the select pin 460.

When one skilled in the art uses an electronic circuit including above described non-muxed type memory controller 310, the wrapper circuit 360 and the select pin 460, a memory system may be easily implemented with a system on a chip (SOC) or a system in a package (SIP) by selecting either a muxed type or a non-muxed type memory. In other words, the one skilled in the art may select a suitable memory of either type, solely by considering power consumption, pin-limitation, capacity, cost, etc and need not consider whether or not the memory is a muxed or a non-muxed type.

Figure 5:
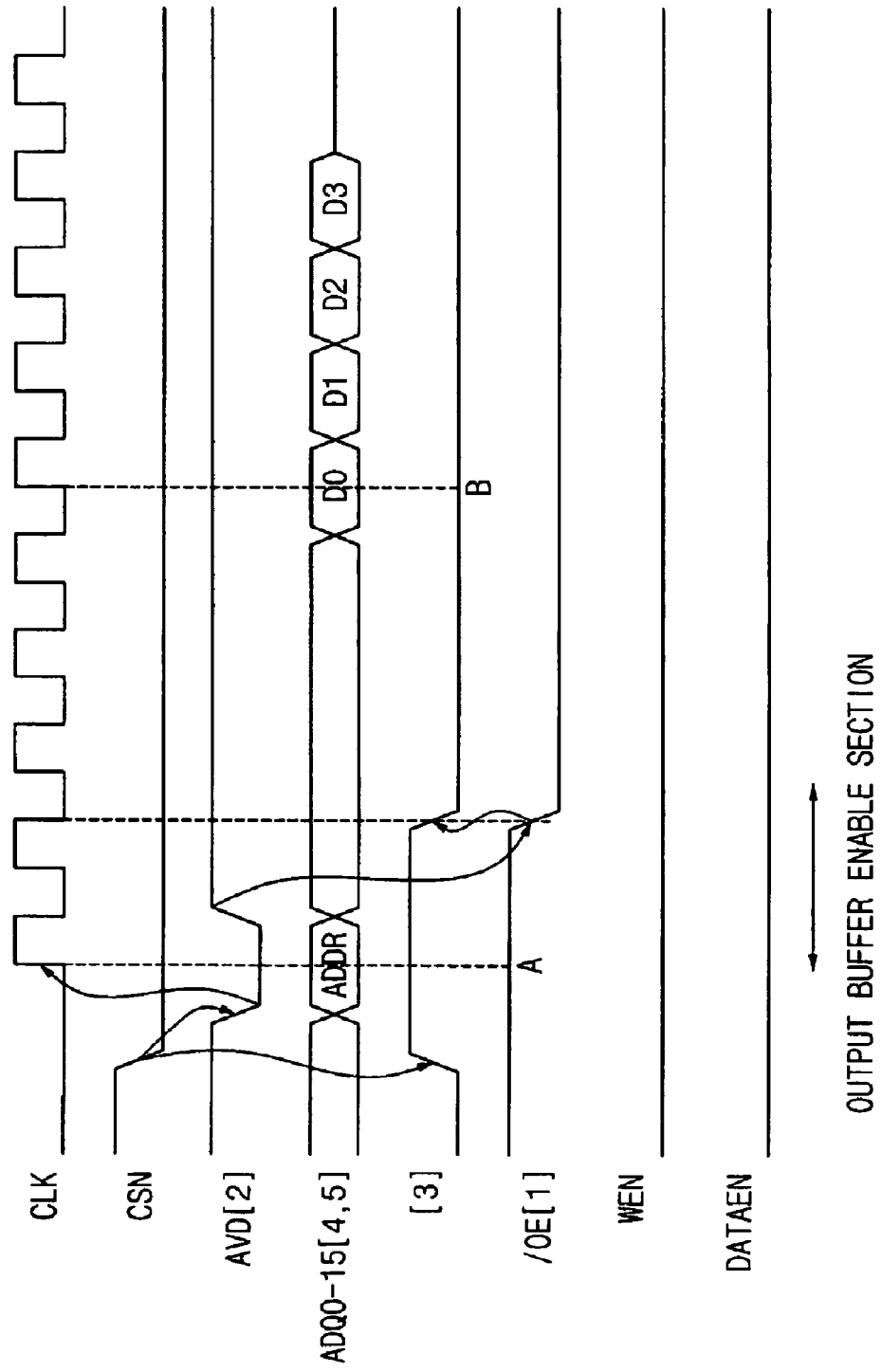
FIG. 5 is a timing diagram illustrating a read operation of the wrapper circuit 360 with a muxed type memory.

FIG. 5 is a timing diagram illustrating a read operation of the wrapper circuit 360 of FIG. 4 with a muxed type memory. Since delay times of an inverter, combinatorial logic gates and of a multiplexer are so short in comparison with a cycle of a clock signal, the delay time, here, is disregarded (considered as 0) for convenience.

A write control signal (WEN) and a data control signal (DATAEN) are in a disabled state during a read operation. Thus, the write control signal (WEN) is maintained in the high state, and the data control signal (DATAEN) is maintained in the low state. When the chip select control signal (CSN) falls to the low state, a read operation begins. When the chip select control signal (CSN) is in the low state, the address valid control signal (AVD) falls to a low state after remaining in the previous (high) state for a predetermined time period. When the address valid control signal (AVD) is in a low state, the memory controller generates a clock (CLK) and an address is read in response to a rising edge of the clock (CLK). On the other hand, when the chip select control signal falls to a low state, an output of the AND-gate 441 becomes high.

When the state of the address valid control signal (AVD) is changed from low to high, the output control signal (OEN) becomes low stated after maintaining in the previous state for a predetermined time period. Here, the signal (/OE) is changed to low state in response to a falling edge of the clock by the flip-flop 451. Meanwhile, when the state of the output control signal (OEN) becomes low, an output of the AND-gate 441 also becomes low, a signal 3 is changed to a low status in response to the falling edge of the clock by the flip-flop 455. When the signal 3 is in a high status, the output buffer 421 is enabled and thus an address read at a point 'A' is sent to the memory through the output buffer 421 via shared (time-multiplexed) address/data port 483.

The memory reads data corresponding to the received address and outputs the data value (or values) to the shared address/data port 483 after a predetermined time. Here, the data is synchronized to the clock and sent to the memory controller through the input buffer 423. In this case, the output buffer 421 becomes enabled.

Figure 6:
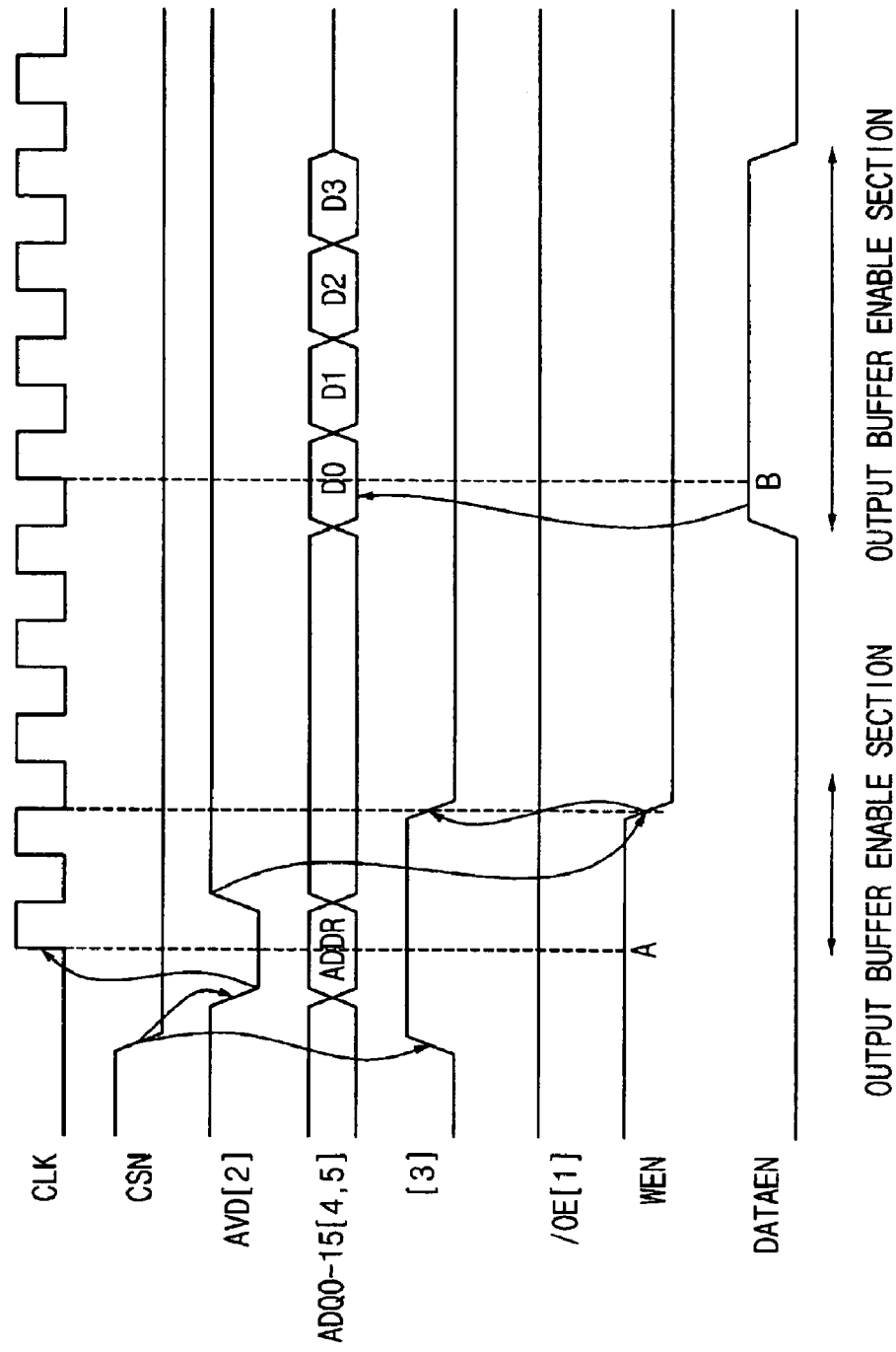
FIG. 6 is a timing diagram illustrating a write operation of a wrapper circuit with a muxed type memory.

FIG. 6 is a timing diagram illustrating a write operation of a wrapper circuit 360 of FIG. 4 with a muxed type memory.

The write control signal (WEN) falls to a low state during the write operation a predetermined time period after the time when the address valid control signal (AVD) is changed from a low status to a high status. The output control signal (OEN) is maintained at a high state during the write operation. The data control signal (DATAEN) is maintained in the low state, then changed into the high state at a time when write data are outputted. The write operation is initiated by the chip select control signal (CSN) falling to a low state. When the state of the chip select control signal (CSN) becomes low, the state of the address valid control signal (AVD) also falls to a low state after being maintained in the previous state for a predetermined time period. When the address valid control signal (AVD) is in a low state, the memory controller generates the clock (CLK) and an address value is received in response to a rising edge of the clock (CLK).

Since the output control signal (OEN) and the write control signal (WEN) are at high states, an output of the AND-gate 441 becomes high when the chip select control signal (CSN) falls to a low state. Further, when the write control signal (WEN) falls to a low state, an output of the AND-gate 441 becomes low. The output of the AND-gate 441 is provided to the flip-flop 455 and the signal 3 is changed into a low status in response to a falling edge of the clock. When the signal 3 is at the high state, the output buffer 421 is enabled and thus an address read at a time 'A' is sent to the memory via the address/data port 483 through the output buffer 421.

Meanwhile, the memory controller 310 raises the state of the data control signal (DATAEN) to a high level after being maintained in the previous state for a predetermined time period, and outputs data. In this case, since the write control signal (WEN) is in a low state, an output of the AND-gate 431 becomes high, so that a selection unit 410 outputs data. Meanwhile, the output buffer 421 is enabled by the data control signal (DATAEN), and thus the data are sent to the memory through the address/data port 483.

In summary, the memory system shown in FIG. 3 includes a memory controller in which an address port, a write data port and a read data port are distinct from one another (non-muxed type), and a memory in which an address port and a data port are shared (muxed type). The memory system shown in FIG. 3 is just one exemplary embodiment of the present invention, and the invention should not be construed as limited to the exemplary embodiments set forth herein.

Figure 7:
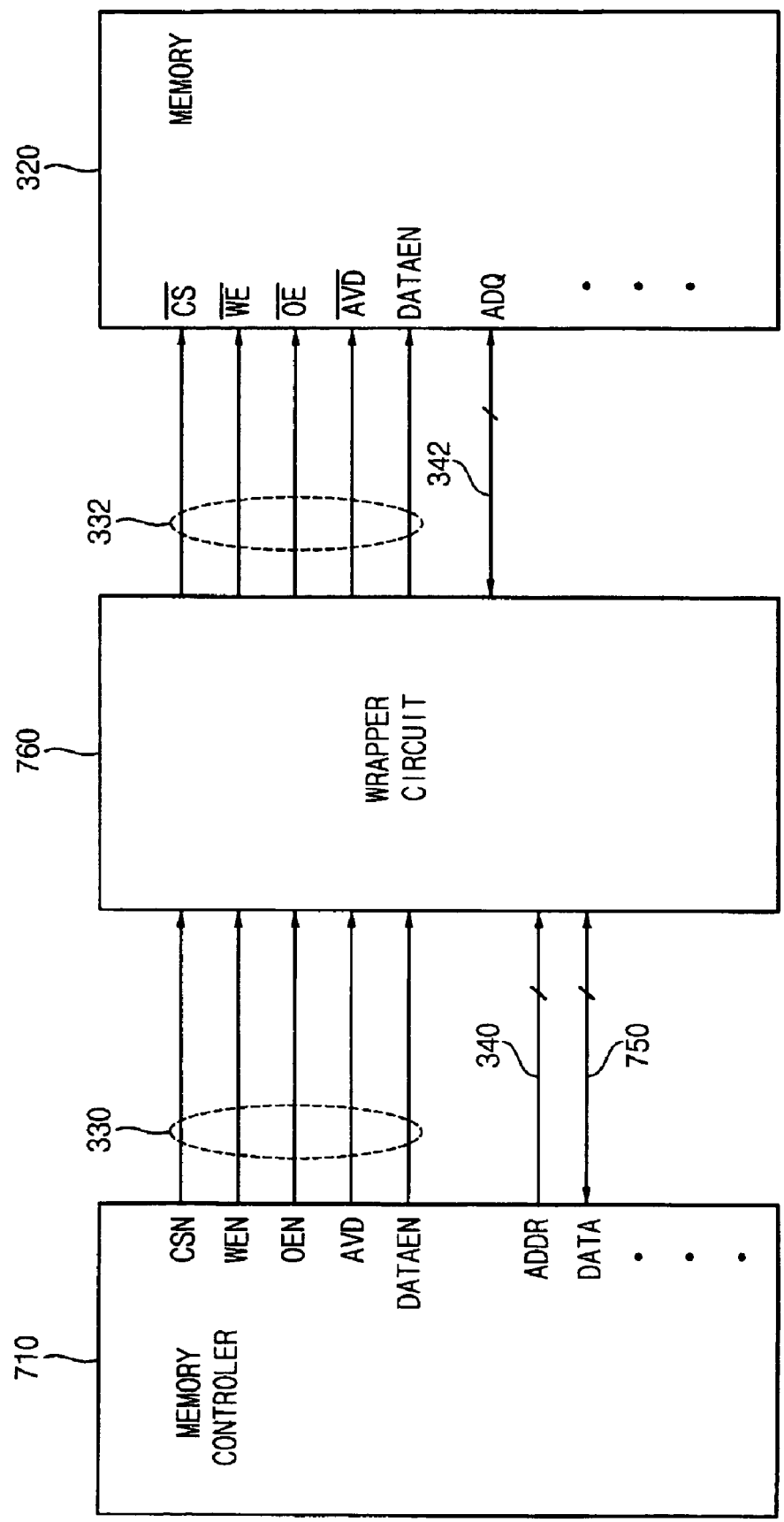
FIG. 7 is a block diagram of a memory system according to another exemplary embodiment of the present invention.
Figure 8:
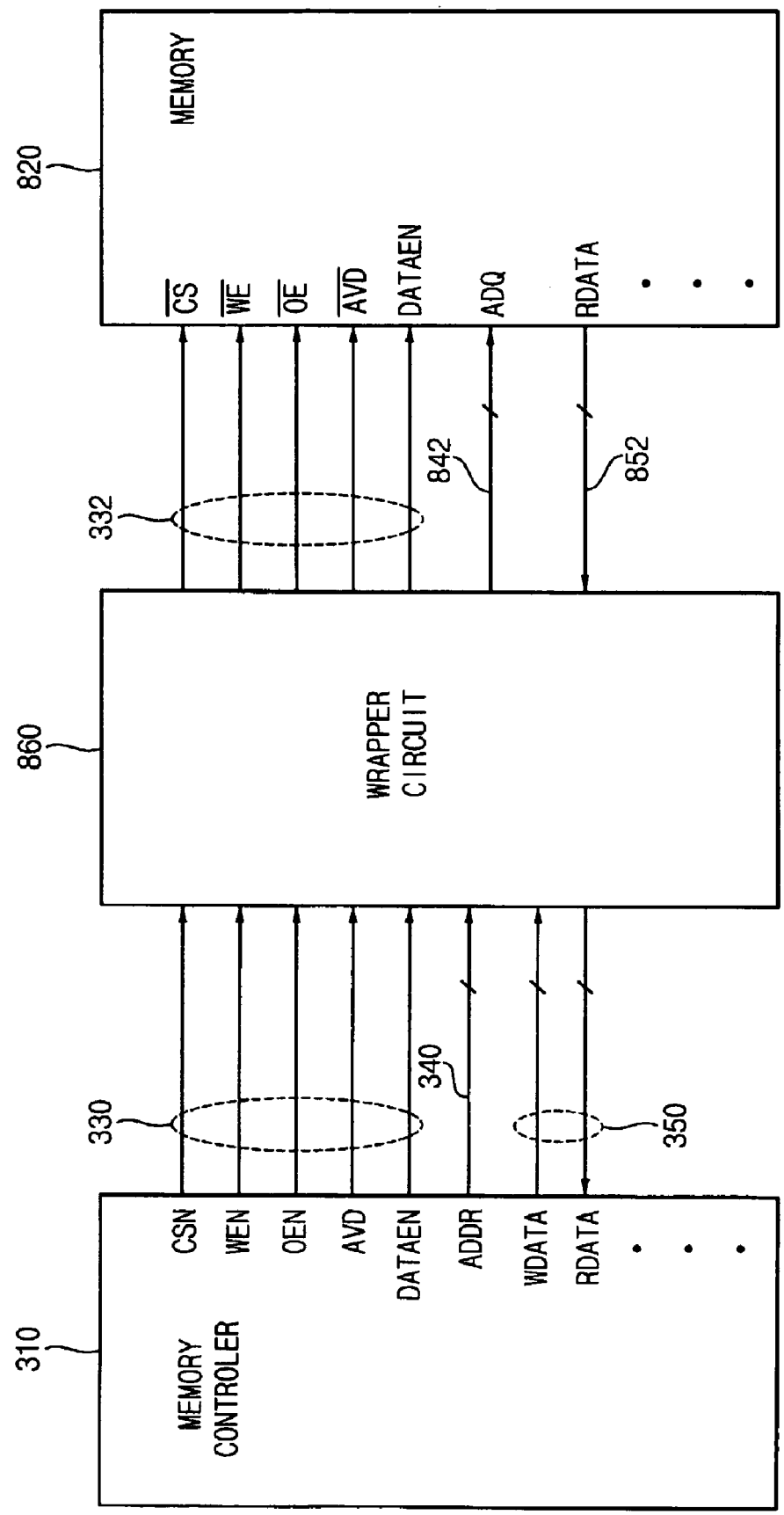
FIG. 8 is a block diagram of a memory system according to still another exemplary embodiment of the present invention.

FIGS. 7, 8 and 9 are block diagrams each illustrating a memory system according to another exemplary embodiment of the present invention.

Referring to FIG. 7, in a memory controller 710, an address port (ADDR) and a data port (DATA) are distinct (separate) from each other. However, unlike as shown in FIG. 3 in case of the memory controller 310, the write data port and the read data port in a memory controller 710 are not distinct (separate) from each other. The memory controller 710 shown in FIG. 7 receives write data 750 and outputs read data 750 through the same data port (DATA), but has a distinct (separate) address port (ADDR) for providing an address 340.

The memory controller 710 is a non-muxed type in which the address port and the single DATA port are distinct from each other. The memory 320 in FIG. 7 is the same memory 320 as in FIG. 3, and is a muxed type in which the address port and a data port are shared (time-multiplexed over the same bus lines).

The wrapper circuit 760 interfaces between the non-muxed type memory controller 710 and the muxed type memory 320. In other words, the wrapper circuit 360 receives the non-multiplexed address 340 or the write data 750 (from a system bus, not shown), and provides the received address 340 or the received write data 750 as time-multiplexed signals 342 to the shared (time-multiplexed) address/data port (ADQ) of the muxed type memory 320. The wrapper circuit 760 receives the read data 342 from the memory 320 and provides the received read data 750 to the data port (DATA) of the memory controller 710.

Referring to FIG. 8, a memory 820 shares (time-multiplexes) an address port and a write data port, but the memory 820 further includes a distinct (separate) read data port (RDATA) (and thus is different from the memory 320 shown in FIG. 3). The memory 820 (shown in FIG. 8) alternately receives an address and write data through the same address/data port (ADQ), and outputs read data through the separate read data port (RDATA).

The memory controller 310 in FIG. 8 is the same non-muxed type memory controller 310 as in FIG. 3 in which the address port ADDR and two data ports (WDATA, RDATA) are distinct from each other. The memory 820 in FIG. 8 is a muxed type in which the address port and a write data port are shared (time-multiplexed over the same bus lines), while the read data port (RDATA) is separate.

The wrapper circuit 860 interfaces between the non-muxed type memory controller 310 and the muxed type memory 820. In other words, the wrapper circuit 860 receives the non-multiplexed address 340 and the write data 350 (from a system bus, not shown), and provides the received address 340 or the received write data 350 as time-multiplexed signals 842 to the shared (time-multiplexed) address/data port (ADQ) of the muxed type memory 820. The wrapper circuit 860 receives the read data 852 from the memory 820 and provides the received read data 350 to the read data port (RDATA) of the memory controller 310.

Referring to FIG. 9, the memory controller 710 is the same as in FIG. 7, in which the address port (ADDR) and the single data port (DATA) are distinct (separate) from each other. However, unlike as shown in FIG. 3 in case of the memory controller 310, the write data (WDATA) port and the read data (RDATA) port are not distinct from each other. Here, the memory controller 710 in FIG. 9 outputs the write data 950 and receives the read data 950 through the same data port (DATA). The memory 820 in FIG. 9 is the same muxed type memory 820 as in FIG. 8 in which the address port and a write data port are shared (time-multiplexed over the same bus lines), while the read data port (RDATA) is separate. The memory 820 shares (time-multiplexes) the address port and the write data port (ADQ), but the memory 820 is different from the memory 320 in FIG. 3 because the memory 920 has a distinct (separate) read data port (RDATA). In other words, the memory 920 in FIG. 9 alternately receives the address and the write data through the same address/data port (ADQ), and outputs the read data through the distinct (separate) read data port (RDATA).

The wrapper circuit 960 interfaces between the non-muxed type memory controller 710 and the muxed type memory 820. In other words, the wrapper circuit 960 receives the non-multiplexed address 340 and the write data 950 (from a system bus, not shown), and provides the received address 340 or the received write data 750 as time-multiplexed signals 842 to the shared (time-multiplexed) address/data port (ADQ) of the muxed type memory 820. The wrapper circuit 960 receives the read data 852 from the memory 820 and provides the received read data 750 to the read data port (RDATA) of the memory controller 710.

Even though the exemplary memory systems in accordance with embodiments of the present invention are mainly described as synchronous memory systems, a memory system in accordance with other embodiments of the present invention may be of the asynchronous type. Further, the memory systems of the present invention may be applied to any memory systems of either the muxed and the non-muxed types. For example, the memory system of the present invention may be also applied to a NOR type of synchronous flash memory system, to synchronous UtRAM memory system, to a NAND type of asynchronous flash memory system, and to a memory system including a NAND type flash memory and SRAM.

As described above, according to the exemplary embodiments of the present invention, the wrapper circuit may easily control a memory, in which the address port and the data port are shared, using a memory controller with which the address port and the data port are distinct.

Further, the electronic circuit may configured to control a memory, in which the address port and the data port are shared, or instead to control a memory, in which the address port and the data port are distinct (separate) from each other based on the value of the muxed select control signal (Muxed-Sel) inputted through the select pin.

The described exemplary embodiments of the present invention may, however, be embodied in many different forms and should not be construed as limited to the exemplary embodiments set forth herein. Rather, these embodiments are provided so that this disclosure will be thorough and complete, so that the claims will convey the scope of the present invention to those skilled in the art.

What is claimed is:

1. An electronic circuit comprising:
   a memory controller having a first address port and a first data port that are distinct from each other; and
   a wrapper circuit coupled to the memory controller and configured to interface the memory controller to one of a first memory or a second memory according to a select signal,
   wherein the wrapper circuit interfaces between the memory controller and the first memory when the select signal indicates the memory controller desires to control the first memory, the first memory having a second address port and a second data port that are not distinct from each other, wherein the wrapper circuit interfaces between the memory controller and the second memory when the select signal indicates the memory controller desires to control the second memory, the second memory having a third address port and a third data port that are distinct from each other, wherein the wrapper circuit comprises:

a select circuit configured to multiplex write data and an address received from the memory controller, and configured to output a selected one of the write data and the address selected according to a first internal control signal; and an input/output buffer configured to receive the selected one of the write data and the address to provide the selected one of the write data or the address to the first memory, and configured to receive read data from the first memory and to pass the received read data to the memory controller; and a control signal processing circuit configured to receive control signals from the memory controller to generate the first internal control signal, wherein the control signal processing circuit includes a timing control circuit configured to control a timing between a selection of the address and a selection of the write data, and a timing of control signals for controlling the first memory, the timing circuit including at least one flip-flop synchronized to a falling edge of a clock, wherein the control signal processing circuit receives a first control signal, a second control signal, a third control signal, a fourth control signal, and the address from the memory controller, and wherein the at least one flip-flop receives the fourth control signal, the third control signal, the address, and a second internal control signal, and the second internal control signal is based on the first control signal, the second control signal, and the fourth control signal.

2. The wrapper circuit of claim 1, wherein the first control signal is a chip select control signal (CSN), the second control signal is a write control signal (WEN), and the third control signal is an address valid control signal (AVD), wherein when the chip select control signal (CSN), the write control signal (WEN) and the address valid control signal (AVD) are enabled, the control signal processing circuit outputs the first internal control signal so that the select circuit may select the write data, and wherein, when one of the chip select control signal (CSN), the write control signal (WEN) and the address valid control signal (AVD) is disabled, the control signal processing circuit outputs the first internal control signal so that the select circuit selects the address.

3. The wrapper circuit of claim 1, wherein the control signal processing unit includes an input/output buffer control circuit configured to provide a control signal to enable the input/output buffer to output the selected one of the address and the write data when a data control signal (DATAEN) and the chip select control signal (CSN) are enabled and while the write control signal (WEN) and an output control signal (OEN) are disabled.

4. The electronic circuit of claim 1, wherein the first data port functions only as a predetermined one of a write data port and a read data port, and the second data port functions alternately as a write data port and as a read data port.

5. The electronic circuit of claim 1, wherein the first data port functions alternately as a write data port and as a read data port, and the second data port functions alternately as a write data port and as a read data port.

6. The electronic circuit of claim 1, wherein the first data port functions only as a predetermined one of a write data port and a read data port, and the second data port functions only as a predetermined one of a write data port and a read data port.

7. The electronic circuit of claim 1, wherein the first data port functions alternately as a write data port and as a read data port, and the second data port functions only as a predetermined one of a write data port and a read data port.

8. The electronic circuit of claim 1, further comprising:

a select pin that receives the select signal as a muxed select control signal (MuxedSel); and wherein while the muxed select control signal (MuxedSel) is enabled the wrapper circuit interfaces between the second memory and the memory controller.

9. The wrapper circuit of claim 1, wherein the at least one flip-flop comprises:

a first flip-flop receiving the fourth control signal;
a second flip-flop receiving the third control signal;
a third flip-flop receiving the second internal control signal; and
a fourth flip-flop receiving the address.

10. The wrapper circuit of claim 1, wherein the control signals for controlling the first memory includes a fifth control signal and a sixth control signal, wherein the fifth control signal is based on one of an output of a first flip-flop of the at least one flip-flop or the fourth control signal in response to the select signal, and wherein the sixth control signal is based on one of an output of a second flip-flop of the at least one flip-flop or the third control signal.

11. A wrapper circuit comprising:

a select circuit configured to select, according to a first internal control signal, one of write data and an address received from a memory controller having a first address port and a first data port that are distinct from each other; and an input/output buffer configured to output the selected one of the write data and the address to a first memory having a second address port and a second data port that are not distinct from each other, and configured to receive read data from the first memory and to pass the received read data to the memory controller; and a control signal processing circuit configured to receive control signals from the memory controller to generate the first internal control signal for controlling the select circuit, wherein the control signal processing circuit includes a timing control circuit configured to control a timing between a selection of the address and a selection of the write data, and a timing of control signals for controlling the first memory, the timing circuit including at least one flip-flop, wherein the at least one flip-flop receives a first control signal and a second control signal from the memory controller, the address, and a second internal control signal, and the second internal control signal is based on the first control signal, and third and fourth control signals from the memory controller.

12. The wrapper circuit of claim 11, further comprising:

a select pin that receives a muxed select control signal (MuxedSel); and wherein while the muxed select control signal is enabled the wrapper circuit interfaces between the memory controller and a second memory having a third address port and a third data port that are not distinct from each other.

13. A memory system comprising:
a memory controller having a first address port and a first data port that are distinct from each other;
a first memory having a second address port and a second data port that are not distinct from each other; and
a wrapper circuit connected between the memory controller and the first memory and configured to interface between the first memory and the memory controller,
wherein the wrapper circuit comprises:
a select circuit configured to select, according to a first internal control signal, one of write data and an address received from the memory controller;
an input/output buffer configured to output the selected one of the write data and the address to the first memory, and configured to receive read data from the first memory and to pass the read data to the memory controller; and
a control signal processing circuit configured to receive control signals from the memory controller to generate the first internal control signal for controlling the select circuit,
wherein the control signal processing circuit includes a timing control circuit configured to control a timing between a selection of the address and a selection of the write data, and a timing of control signals for controlling the first memory, the timing circuit including at least one flip-flop and
wherein the at least one flip-flop receives a first control signal and a second control signal from the memory controller, the address, and a second internal control signal, and the second internal control signal is based on the first control signal, and third and fourth control signals from the memory controller.

14. The memory system of claim 13, further comprising:
a select pin configured to receive a muxed select control signal (MuxedSel); and
wherein the wrapper circuit interfaces between the memory and the memory controller while the muxed select control signal (MuxedSel) is enabled.

15. An interfacing method comprising:
receiving an address from a first address port of a memory controller and receiving write data from a first data port of the memory controller wherein the first address port and the first data port are physically distinct from each other;
sequentially providing the received address and the received write data from the memory controller to a memory having a second address port and a second data port that are not physically distinct from each other;
controlling a timing between a selection of the address and a selection of the write data using a timing circuit and controlling a timing between control signals for controlling the memory, the timing circuit including at least one flip-flop; and
passing read data received from the first memory to the memory controller,
wherein controlling the timing between control signals for controlling the memory comprises:
sending a first control signal and a second control signal of the memory controller to a first flip-flop and a second flip-flop respectively; and
outputting one of the first control signal or an output of the first flip-flop to the memory in response to a selection signal and outputting one of the second control signal or an output of the second flip-flop to the memory in response to the selection signal.

16. The interfacing method of claim 15, wherein providing the received address or the received write data includes:
passing the write data to the memory when a chip select control signal (CSN) of the memory controller, a write control signal (WEN) and an address valid control signal (AVD) are enabled; and
passing the address to the memory when one of the control signal (CSN), the write control signal (WEN) and the address valid control signal (AVD) is disabled.

17. The interfacing method of claim 15, wherein the first data port functions only as a predetermined one of a write data port and a read data port, and the second data port functions alternately as a write data port and as a read data port.

18. The interfacing method of claim 15, wherein the first data port functions alternately as a write data port and as a read data port, and the second data port functions alternately as a write data port and as a read data port.

19. The interfacing method of claim 15, wherein the first data port functions only as a predetermined one of a write data port and a read data port, and the second data port functions only as a predetermined one of a write data port and a read data port.

20. The interfacing method of claim 15, wherein the first data port functions alternately as a write data port and as a read data port, and the second data port functions only as a predetermined one of a write data port and a read data port.

* * * * *